United States Patent
Wagner et al.

(10) Patent No.: US 7,700,425 B2
(45) Date of Patent: Apr. 20, 2010

(54) RAISED SOURCE DRAIN MOSFET WITH AMORPHOUS NOTCHED GATE CAP LAYER WITH NOTCH SIDEWALLS PASSIVATED AND FILLED WITH DIELECTRIC PLUG

(75) Inventors: Tina J. Wagner, Newburgh, NY (US); Werner A. Rausch, Stormville, NY (US); Sadanand V. Deshpande, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 560 days.

(21) Appl. No.: 11/585,361

(22) Filed: Oct. 23, 2006

(65) Prior Publication Data

US 2007/0037356 A1 Feb. 15, 2007

(51) Int. Cl.
*H01L 21/8238* (2006.01)

(52) U.S. Cl. ............................. 438/199; 257/E21.301; 257/E21.43

(58) Field of Classification Search .................. 438/199, 438/279, 301, 303; 257/283, 324, 369, 390, 257/E21.301, E21.43
See application file for complete search history.

(56) References Cited

U.S. PATENT DOCUMENTS 5,348,616 A * 9/1994 Hartman et al. ............... 216/48
6,030,863 A 2/2000 Chang et al. ................. 428/229
6,143,611 A * 11/2000 Gilton et al. ................. 438/279
6,261,911 B1 * 7/2001 Lee et al. ..................... 438/300
6,589,827 B2 * 7/2003 Kubo et al. .................. 438/157

* cited by examiner

*Primary Examiner*—David Vu
(74) *Attorney, Agent, or Firm*—Graham S. Jones, II; H. Daniel Schnurmann (57) ABSTRACT

A method is provided for forming an SOI MOSFET device with a silicon layer formed on a dielectric layer with a gate electrode stack, with sidewall spacers on sidewalls of the gate electrode stack and raised source/drain regions formed on the surface of the silicon layer. The gate electrode stack comprises a gate electrode formed of polysilicon over a gate dielectric layer formed on the surface of the silicon layer. A thin amorphous silicon cap layer is formed in the top surface of the gate electrode by implanting dopant into the surface thereof. A notch is etched into the periphery of the cap layer. A plug of dielectric material is formed in the notch. The sidewalls of the gate electrode are covered by the sidewall spacers which cover a portion of the plug for the purpose of eliminating the exposure of the gate polysilicon so that formation of spurious epitaxial growth during the formation of raised source/drain regions is avoided.

16 Claims, 8 Drawing Sheets

RAISED SOURCE DRAIN MOSFET WITH AMORPHOUS NOTCHED GATE CAP LAYER WITH NOTCH SIDEWALLS PASSIVATED AND FILLED WITH DIELECTRIC PLUG

BACKGROUND OF INVENTION

This invention relates to methods of manufacture of FET semiconductor device, and more particularly to methods of manufacture of SOI CMOS structures and devices manufactured thereby.

Scaling (reduction in dimensions) of Silicon-On-Insulator (SOI) Complementary Metal Oxide Semiconductor (CMOS) structures requires scaling of the silicon thickness to achieve device performance targets (short channel control, etc.).

Figure 1A:
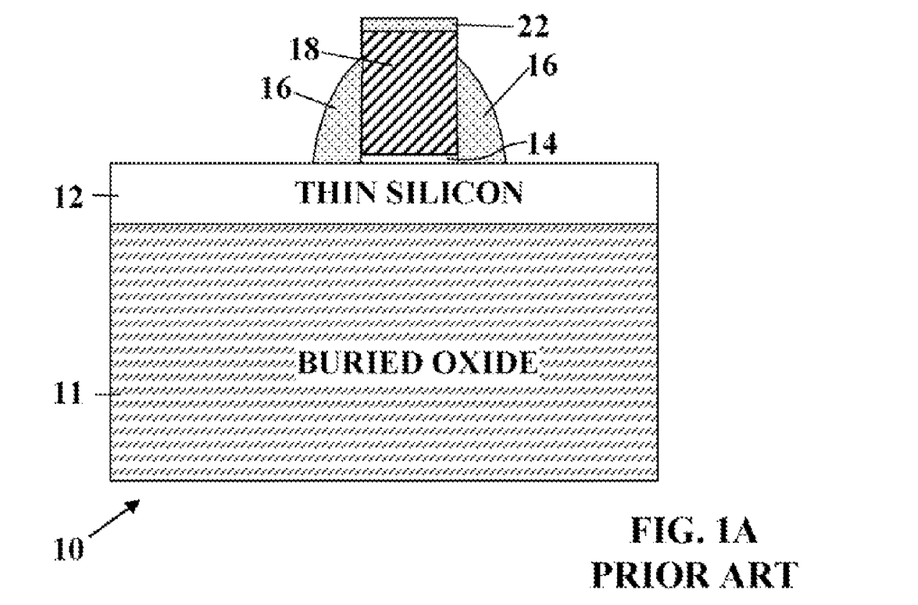
FIG. 1A shows the typical structure of a prior art SOI CMOS FET device before formation of the epitaxial, raised source/drain regions of FIG. 1B on top of the upper surface of the thin silicon layer of the device.
Figure 1B:
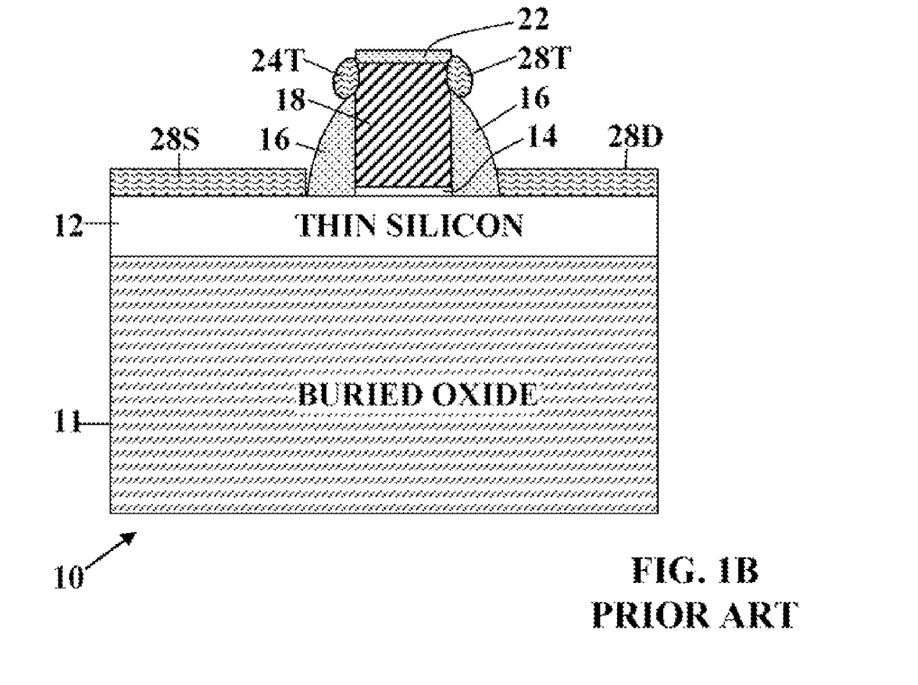
FIG. 1B shows the device 10 of FIG. 1A after growth of the raised source and the raised drain by epitaxial growth of silicon on top of the upper surface of the thin silicon layer of the top of the substrate with spurious growth of unwanted, spurious nodules at the upper corners of the gate electrode formed during the process of epitaxial growth.

FIG. 1A shows the typical structure of a prior art SOI device 10 prior to epitaxial growth of the epitaxial, raised source/drain regions 28S/28D of FIG. 1B on the surface of semiconductor substrate comprising the thin silicon layer 12 of the device 10. The substrate of the device 10 includes a thin silicon layer 12 formed on a Buried OXide (BOX) layer 11. A gate electrode stack is formed above the thin silicon layer 12. The gate electrode stack includes a gate dielectric (gate oxide) layer 14, a gate electrode 18 composed of polysilicon formed above the gate dielectric layer 14, and a hard mask 22 formed above the gate electrode 18. Sidewall spacers 16 composed of silicon oxide have been formed on the sidewalls of the gate electrode 18 and are intended to cover the sidewall surfaces of the gate electrode 18 entirely.

Note the pull-down of the spacers 16 below the hard mask 22 resulting in exposure of some of the sidewall surfaces of the polysilicon at the top corners of the gate electrode 18. This is typical of the problem of spacer pull-down due to normal processing (spacer overetch, etc.). Reduction of this pull-down by means known heretofore would tend to reduce the robustness of the overall process (residual nitride, etc).

FIG. 1B shows the device 10 of FIG. 1A after the epitaxial growth of the epitaxial raised source 28S and the epitaxial raised drain 28D on the surface of the thin silicon layer 12 of the substrate of the device 10.

The problem which is illustrated by FIG. 1B is that the exposure of the upper corners of the gate electrode 18 has led to spurious growth of epitaxial silicon nodules 28T which are seen in the regions exposed at the top corners of the gate electrode 18, as shown on either side thereof.

The processing requirement in the past has been to protect the polysilicon of the gate polysilicon 18 with spacers 16 for the purpose of avoiding the formation of spurious epitaxial growth of such epitaxial silicon nodules during the formation of epitaxial, raised source drain regions.

Silicidation is the process of converting a Silicon (Si) material to a silicide material. As a result of the silicidation process, the consumption of silicon thereby depends on the type of silicide being formed. For example, formation of cobalt silicide (CoSi) consumes more silicon than formation of nickel silicide (NiSi). Raised source and drain structures are required in SOI CMOS because the silicon layer in which the device is formed is reduced in thickness. This is the primary enabling element, i.e. strategy, for achieving continued reduction in silicon thickness.

The process of formation of raised source/drain regions suffers from a very limited process window. Any exposure of the gate polysilicon 18 through either the hard mask 22 and/or above the sidewall spacers 16 results in unwanted epitaxial growth of silicon nodules 28T on the upper surfaces of the gate electrode 18 where they are exposed.

SUMMARY OF INVENTION

An object of this invention is to provide a method/process for forming a structure which eliminates the propensity for exposure of gate polysilicon.

Another object of this invention is to provide such a structure.

In accordance with this invention, a method is provided for forming an SOI MOSFET device on a semiconductor substrate comprising a silicon semiconductor layer formed on a dielectric layer, with a gate electrode stack formed over the semiconductor substrate. Sidewall spacers are formed on sidewalls of the gate electrode stack and raised source/drain regions are formed on the surface of the silicon layer. The gate electrode stack comprises a gate electrode formed of polysilicon above a gate dielectric layer, which is formed on the surface of the silicon layer of the semiconductor substrate. A thin, amorphous silicon cap layer is formed in the top surface of the gate polysilicon by ion implantation of dopant therein. A hard mask is formed on top of the cap layer. A notch is formed in the periphery of the cap layer between the gate electrode and the hard mask. The notch is filled with a plug composed of a dielectric material. The plug formed in the notch extends down below the level of the top of the sidewall spacers for the purpose of eliminating the exposure of the gate polysilicon to avoid formation of spurious epitaxial growth of silicon nodules during the formation of the raised source/drain regions on the top surface of the semiconductor substrate.

BRIEF DESCRIPTION OF DRAWINGS

The foregoing and other aspects and advantages of this invention are explained and described below with reference to the accompanying drawings, in which.

DETAILED DESCRIPTION

Figure 2A:
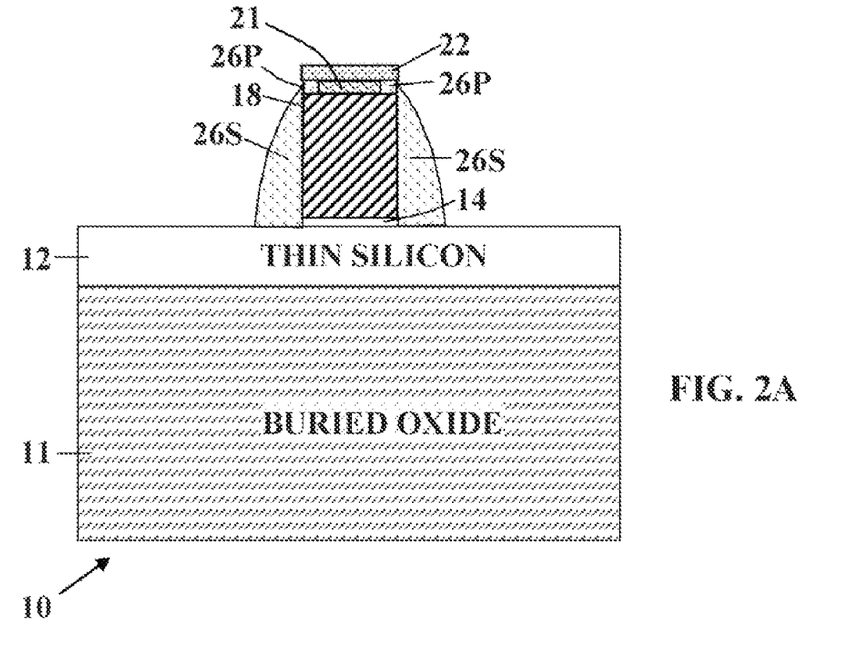
FIG. 2A shows the device of FIG. 1A, which has been modified in accordance with this invention by forming a thin, amorphous silicon cap layer in the upper surface of the gate electrode prior to forming the hard mask on the top surface of the gate electrode, above the thin, amorphous silicon cap layer. Notches are shown formed at the top of the gate electrode 18 in the outer edges of the thin, amorphous silicon cap layer. The notches are filled with dielectric plugs to prevent formation of the kinds of unwanted, spurious, nodules seen in FIG. 1B on the polysilicon at the upper end of the gate electrode.
Figure 2B:
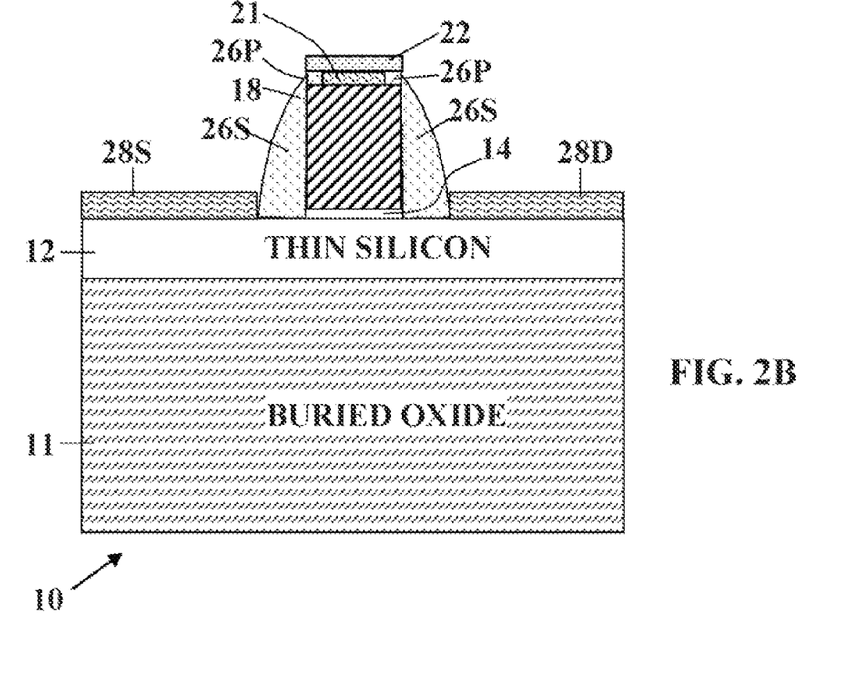
FIG. 2B shows the device of FIG. 2A after raised source/drain formation with the improvement that the epitaxial growth is on the source and drain only without formation of any nodules of epitaxial silicon on the top corners of the gate polysilicon.

Referring to FIGS. 2A and 2B, this invention provides a method for defining an epitaxial raised source region 28S and an epitaxial raised drain region 28D over a semiconductor substrate without forming the unwanted, spurious, silicon nodules 28T shown upon the upper edges of the gate electrode 18 of FIG. 1B. The source/drain regions 28S/28D are self-aligned with the gate electrode 18 and its sidewall spacers with a good process window. In particular, this invention provides a method/process for forming the structure of FIG. 1B without the growth of the spurious nodules 28T by protecting against the exposure of the polysilicon of the sidewalls of the gate electrode 18 to the epitaxial deposition process, which forms the epitaxial raised source/drain regions 28S/28D over the semiconductor substrate on the top surface of the thin silicon layer 12.

The process requirement of the method of this invention is to insert an additional layer of dielectric material between the gate polysilicon of the gate electrode 18 and the spacers 26S for the purpose of eliminating the exposed polysilicon of the gate polysilicon of the gate electrode 18 and thereby avoiding the formation of spurious epitaxial growth during the formation of raised source/drain regions 28S/28D.

FIG. 2A shows the device 10 of FIG. 1A, which has been modified in accordance with this invention by forming a thin amorphous silicon cap layer 21 in the upper surface of the gate polysilicon of the gate electrode 18 prior to forming the hard mask 22 on the top surface of the gate polysilicon of the gate electrode 18, above the thin amorphous silicon cap layer 21. Then notches 24 (shown in FIGS. 3F and 3G) were formed below the hard mask 22 at the top of the gate electrode 18 in the thin amorphous silicon cap layer 21, by etching away the outer edges of the thin amorphous silicon cap layer 21, as shown in FIGS. 3F and 3G. The notches 24 at the top of the gate electrode 18 were filled with dielectric plugs 26P thereby forming a Top Notched Gate (TNG) structure. The notches 24 were filled with the dielectric plug 26P to prevent formation of the kinds of nodules 28T seen in FIG. 1B, on the polysilicon at the upper end of the gate electrode 18, as shown in FIGS. 3F and 3G.

FIGS. 2A and 2B are analogous to FIGS. 1A and 1B, showing the structure before and after the formation of the epitaxial, raised source/drain regions 28S/28D.

FIG. 2A shows the structure of the SOI device 10 in accordance with this invention, prior to epitaxial growth of the raised source/drain regions 28S/28D of FIG. 2B on the surface of the thin silicon layer 12 of substrate of the device 10. The device 10 includes the substrate which comprises a thin silicon layer 12 formed on a Buried OXide (BOX) layer 12. A gate electrode stack is formed on the top surface of the thin silicon layer 12. The gate electrode stack includes a dielectric (gate oxide) layer 14 formed above the thin silicon layer 12. A gate electrode 18 composed of polysilicon formed above the gate dielectric layer 14; the notched, thin, amorphous, silicon, cap layer 21 bordered by the dielectric plugs 26P (composed of silicon oxide) formed on the upper surface the gate electrode 18; and the hard mask 22 covering the upper surfaces of the thin, amorphous silicon, cap layer 21 and the upper surfaces of the dielectric plugs 26P. Sidewall spacers 26S have been formed on the sidewalls of the gate electrode 18. The sidewall spacers 26S, which are composed of silicon oxide, cover the sidewall surfaces of the gate electrode 18 entirely.

Moreover, the sidewall spacers 26S reach up high enough from the silicon layer 12 to overlap the edges of the dielectric plugs 26P. The thin amorphous silicon cap layer 21 and the dielectric plugs 26P are covered by the hard mask 22. In other words, the sidewall spacers 26S, which cover the sidewalls of the gate electrode 18, are contiguous with and overlap the outer edges of the dielectric plugs 26P, which fill the notches 24, as shown in FIGS. 3F and 3G. The dielectric plugs 26P are formed at the top of the gate electrode 18 by etching away the outer edges of the thin, amorphous silicon cap layer 21 thereby recessing the periphery of the thin, amorphous silicon cap layer 21 as described below with reference to FIGS. 3H and 3I. A key feature of FIG. 2A is that it shows spacer pull-down of the spacers 26S, extending down to the same level as the spacers 16 shown in FIG. 1A, but the dielectric plug 26P prevents exposure of the polysilicon of the gate electrode 18 during the step of forming the raised source/drain regions 28S/28D on the top surface of the substrate, thereby inhibiting formation of silicon nodules at the peak of the gate electrode 16.

FIG. 2B shows the device 10 of FIG. 2A after formation of the epitaxial, raised source/drain regions 28S/28D over the top surface of the silicon 21 layer of the substrate with the improvement that the epitaxial growth is only at the site of the epitaxial, raised source region 28S and the epitaxial, raised drain regions 28. As a result, there is no spurious growth of epitaxial silicon nodules on the top corner of the polysilicon of the gate electrode 18 of the kind seen in FIG. 1B adjacent to the dielectric plugs 26P, during the formation of the epitaxial, raised source/drain regions 28S/28D. The tops of the sidewall spacers 26S, in addition to covering the sidewalls of the gate electrode 18, are contiguous with and overlap the outer edges of the dielectric plugs 26P.

FIGS. 3A-3J illustrate the process flow employed to construct the structure of FIGS. 2A and 2B. One advantage of the method/structure of this invention is that there is very little processing required above the normal process flow. The key is to form a Top Notched Gate (TNG) structure with peripheral notches 24 shown in FIGS. 3F and 3G, which can then be filled, as illustrated in FIGS. 3F and 3G, with a set of dielectric plugs 26P during the normal process flow. The structure is formed using the following steps.

Figure 3A:
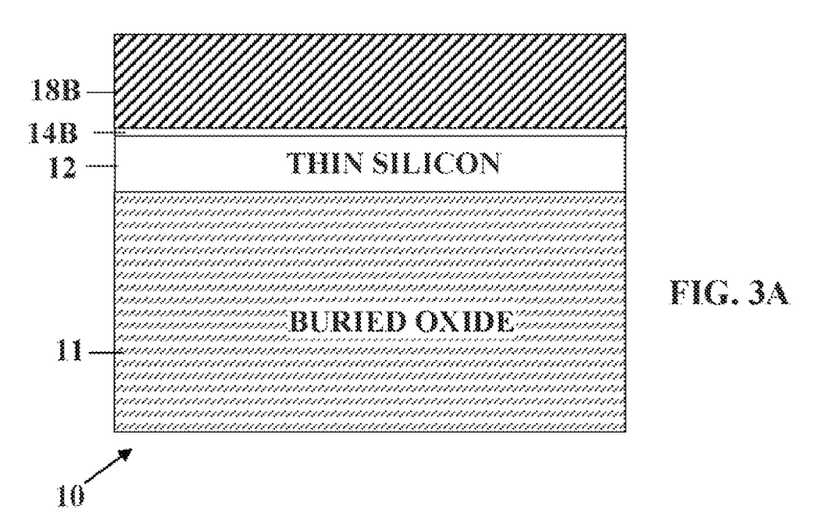
FIGS. 3A-3J illustrate the process flow in accordance with this invention for constructing the device of FIGS. 2A and 2B.
Figure 3B:
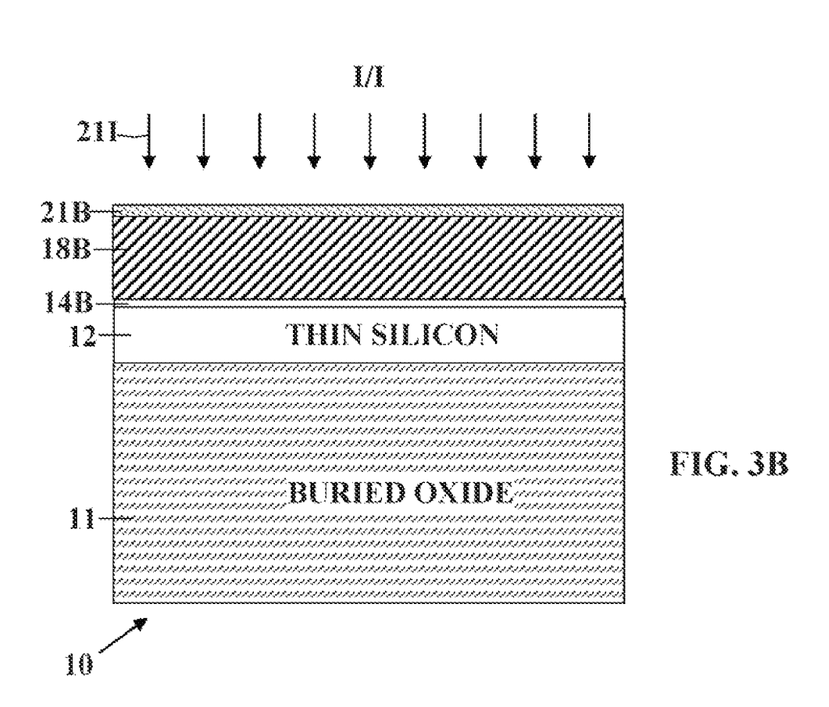

Preparation for the selective undercutting of a thin region at the top of the gate polysilicon of gate electrode 18 of FIGS. 2A and 2B must be done in a controlled and repeatable manner by forming the thin amorphous silicon cap layer 21B shown in FIG. 3B in the surface of the polysilicon layer 18B of FIG. 3A which is to be formed into a the gate electrode 18 of FIGS. 2A, 2B, 3I and 3J.

FIG. 3A shows a potential gate electrode stack formed on an SOI substrate comprising a Buried OXide (BOX) layer 11 of silicon dioxide covered with a conventional SOI thin silicon layer. Then a blanket layer of gate oxide layer 14B was formed on the top surface of the thin silicon layer 12 of the substrate and a blanket polysilicon layer 18B was formed over the top surface of the blanket gate oxide layer 14B. The blanket polysilicon layer 18B may be doped or undoped.

FIG. 3B shows the stack of FIG. 3A after the first step of the present invention leading to the formation of the TNG structure of this invention, which is to form a blanket, thin amorphous silicon cap layer 21B in the top surface of the blanket polysilicon layer 18B by the process of ion implantation of ions 21I into the top surface of the blanket polysilicon layer 18B provided for the formation of gate electrode 18. Germanium or silicon ions (21I) are implanted into the blanket polysilicon layer 18B with a dose sufficient to amorphize the desired thickness of the blanket polysilicon layer 18B to form the thin, amorphous silicon cap layer 21B in the top surface of the blanket polysilicon layer 18B. The thickness of the thin, amorphous silicon cap layer 21B can be tailored by the choice of ion energy used.

Figure 3C:
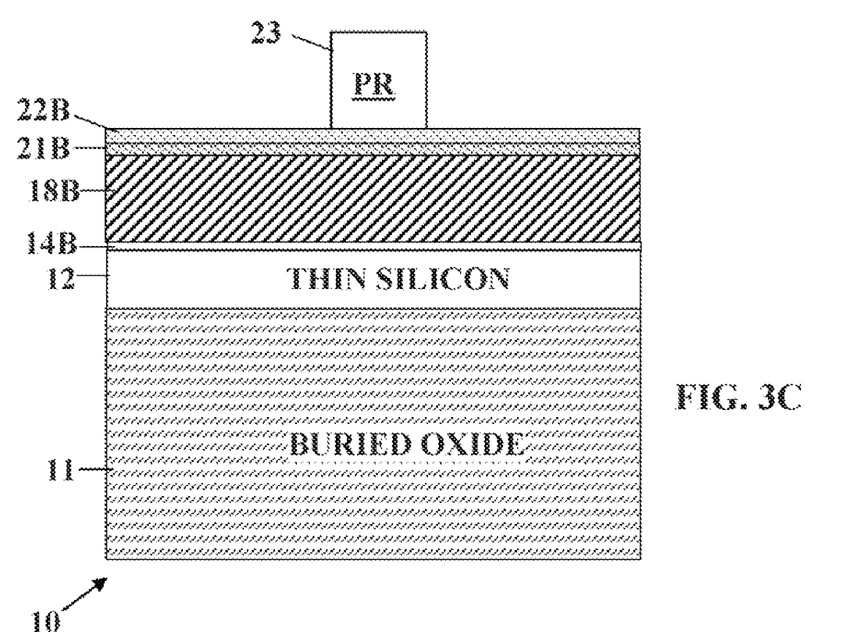

FIG. 3C shows a process of gate patterning applied to the device 10 of FIG. 3B. This is done starting with the deposition on the top surface of the surface of the blanket thin, amorphous silicon cap layer 21B of a blanket hard mask layer 22B composed of a hard mask material (e.g. silicon nitride, TEOS, etc.) and then proceeding with the initial steps of photolithographic patterning by forming a photoresist (PR) mask 23 on the top surface of the blanket hard mask layer 22B.

Figure 3D:
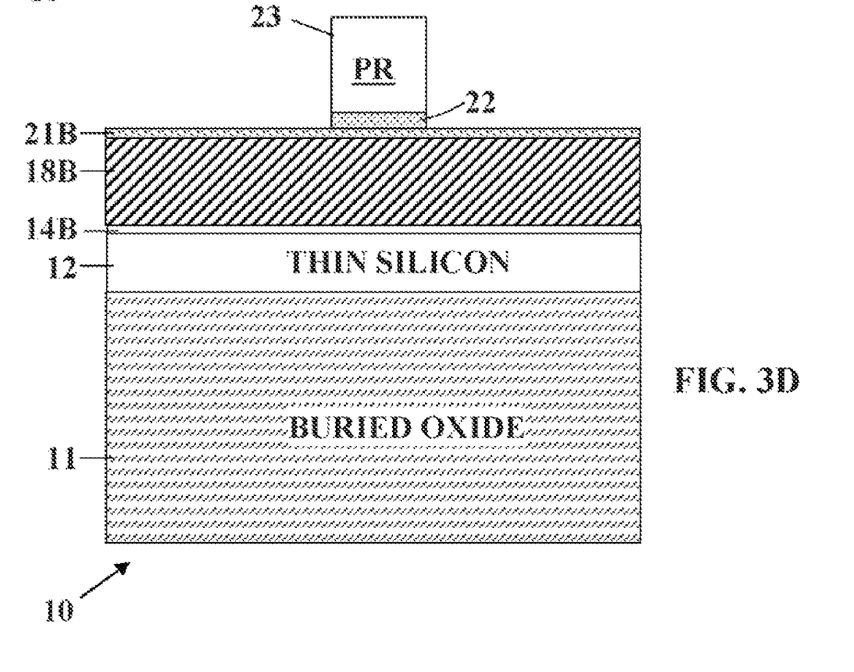

FIG. 3D shows the device 10 of FIG. 3C after the photoresist mask 23 has been used during etching of the hard mask layer 22B into the pattern of the photoresist mask 23, by hard mask Reactive Ion Etching (RIE) to form a patterned hard mask 22 adapted for patterning the gate electrode stack.

Figure 3E:
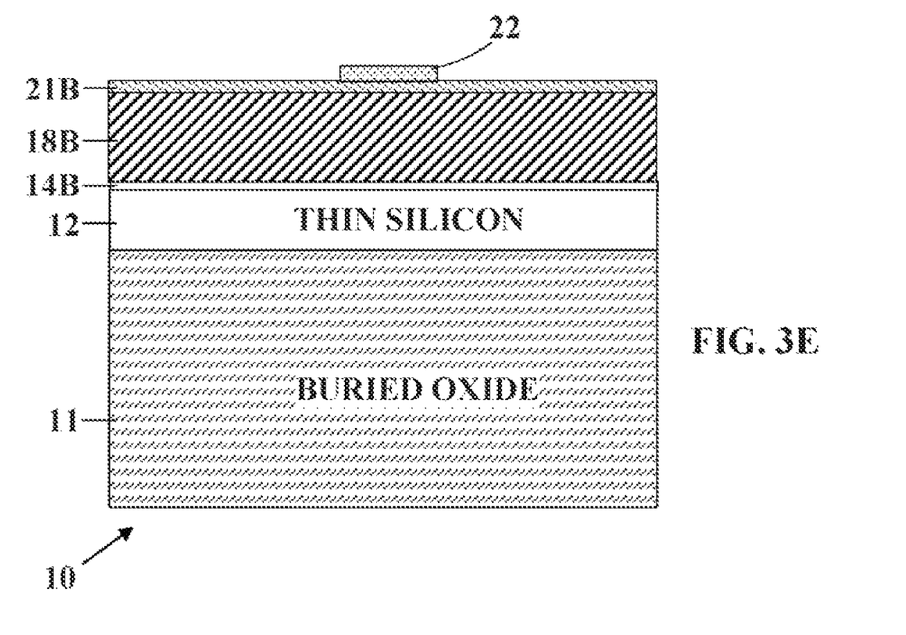
Figure 3F:
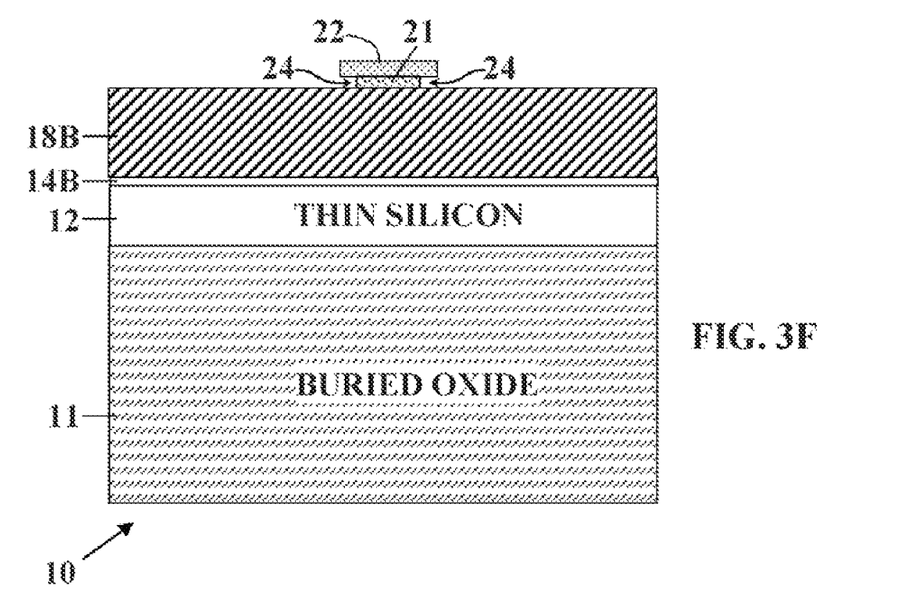
Figure 3G:
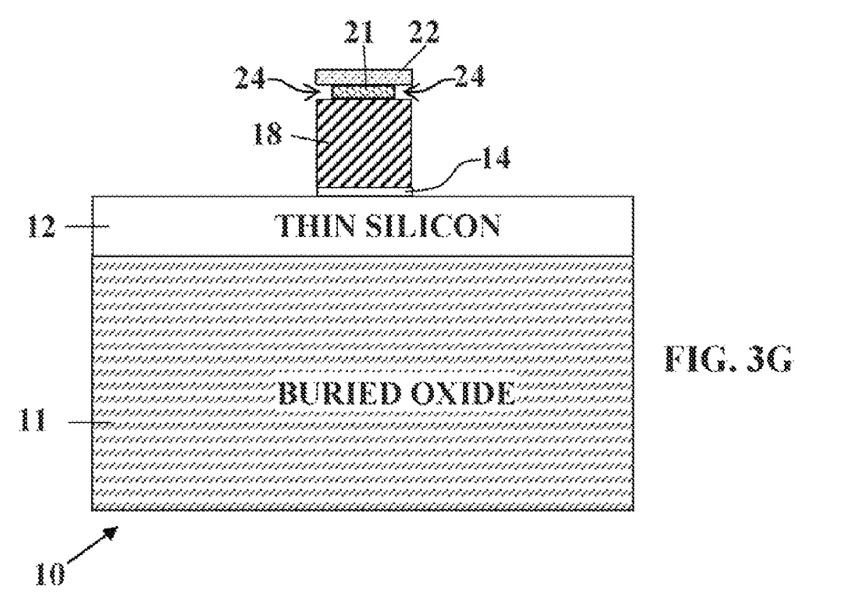

FIG. 3E shows the device 10 of FIG. 3D after stripping of the PR mask 23 from the patterned hard mask 22.

Figure 4:
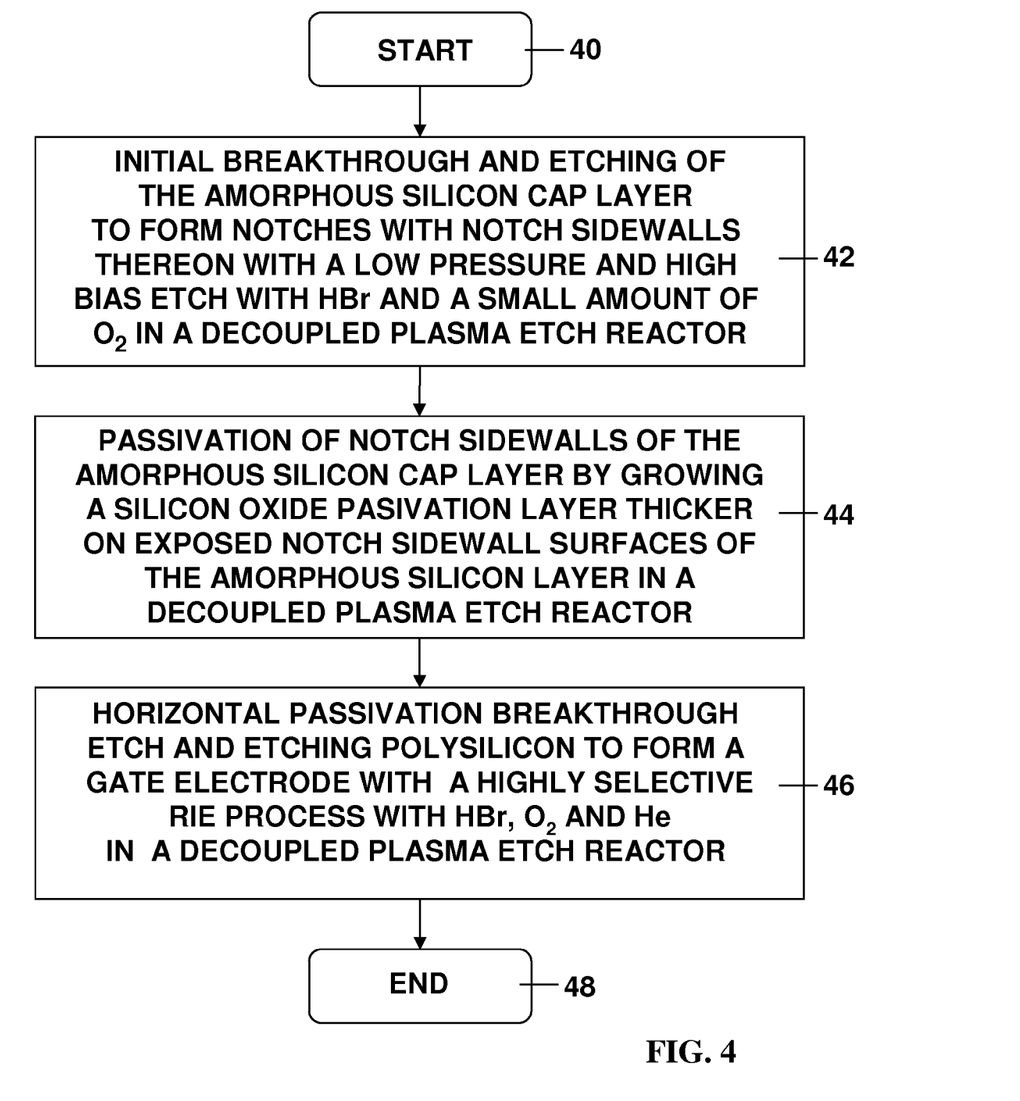
FIG. 4 is a process flow chart of the plasma etching steps used as illustrated by FIGS. 3E to 3G to selectively undercut the selectively amorphized, cap layer at the top of the blanket polysilicon layer to form notches and then to planarize notch side-walls and to etch the gate polysilicon and gate dielectric to form the gate electrode.

FIG. 3F shows the device 10 of FIG. 3E after the TNG selective formation of the undercut notches 24 in the thin, amorphous silicon cap layer 21B of FIG. 3E. After the undercut notches 24 are formed below the hard mask 22, the thin, amorphous silicon cap 21 remains between those undercut notches 24. A step of selective undercutting of the amorphized layer 21B is employed to form the under-cut notches 24 in the thin, amorphous silicon cap layer 21B. Referring to FIG. 4, the step 42 of selective undercutting followed by the step 44 of passivation of notch sidewalls are performed during plasma etching and passivation (described in detail below with reference to FIG. 4). The plasma etching process step involves removing the peripheral portion of the thin amorphous silicon cap layer 21B to form the undercut notches 24 at the edges thereof recessed below the patterned hard mask 22, producing the thin, notched, amorphous silicon cap 21 which remains intact between the undercut notches 24 and below the patterned hard mask 22, which remains intact as shown in FIGS. 3E and 3F.

FIG. 3G shows the device of FIG. 3F, with the TNG structure after anisotropic etching of the blanket polysilicon layer 18B and the blanket gate dielectric layer 14B by RIE (described in detail below with reference to step 46 in FIG. 4) to form the polysilicon gate electrode 18 and gate dielectric layer 14 aligned with hard mask 22. This is done with a standard RIE etch for selectively and anisotropically etching polysilicon aligned with respect to the hard mask 22.

Figure 3H:
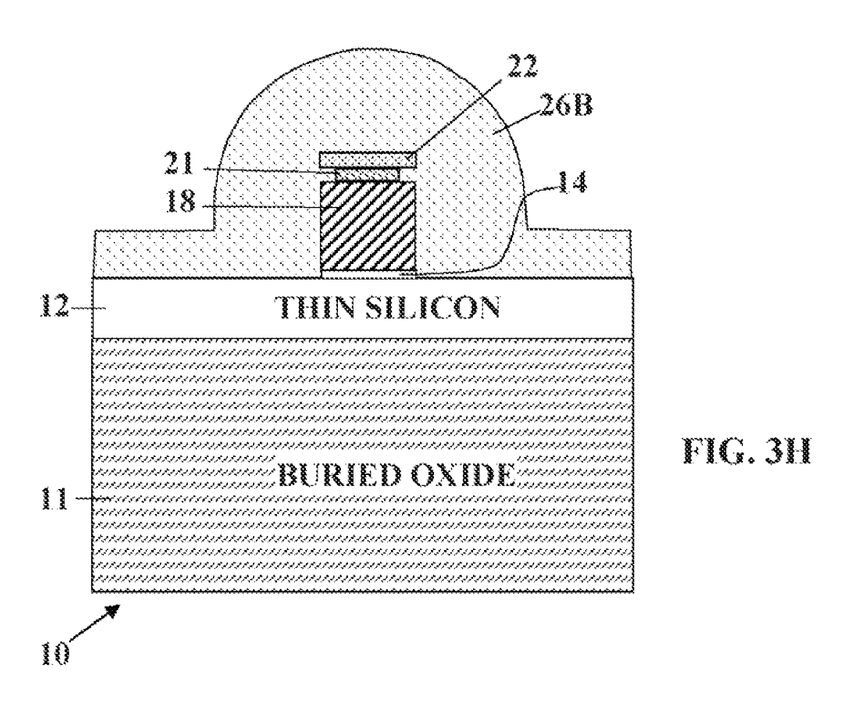

FIG. 3H shows the device 10 of FIG. 3G after blanket deposition of a sidewall spacer layer 26B composed of an appropriate sidewall spacer material covering the surface of device 10 while at the same time it is filling the notches 24 in on the recessed edges on the periphery of the thin, notched, amorphous silicon cap 21 with material which at this point in the process is an integral part of the sidewall spacer layer 26B. That sidewall spacer material will provide the plugs 26P seen in FIGS. 2A, 2B, 3I and 3J. The sidewall spacer material in the sidewall spacer layer 26B is composed of any spacer material such as a dielectric material, e.g. silicon oxide or silicon nitride.

Figure 3I:
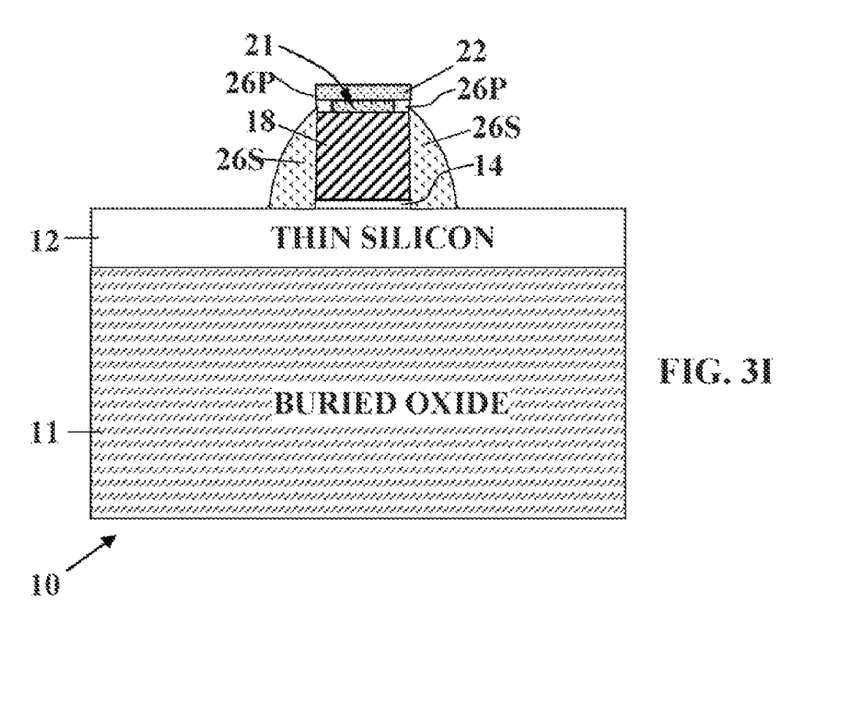
Figure 3J:
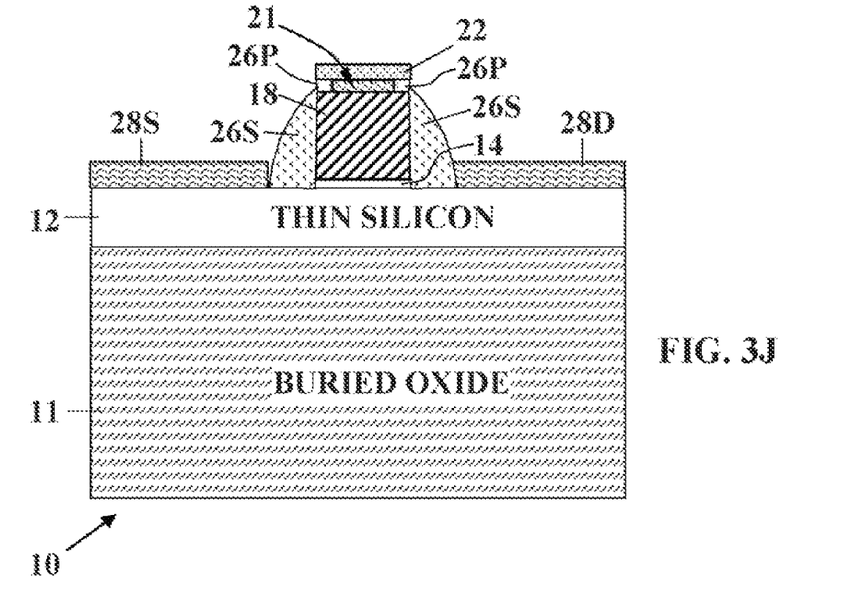

FIG. 3I shows the device 10 of FIG. 3H after etching back the spacer layer 26B to form the spacers 26S on the sidewalls of the gate electrode 18 and at the same time to form protective, dielectric plugs 26P in the undercut notches 24 on the edges of the amorphous silicon cap layer 21 at the top of the gate electrode 18, to provide for protection of the polysilicon of the gate electrode 18 from formation of unwanted, spurious growth of silicon nodules during the subsequent formation of epitaxial raised source/drain regions 28S/28D shown by FIG. 3J.

FIG. 3J shows the device of FIG. 3I after formation of the epitaxial, raised source/drain regions 28S/28D juxtaposed with the sidewall spacers 26S with no nodules formed at the top of the gate electrode 18 adjacent to the protective, dielectric plugs 26P during the epitaxial process used to form the epitaxial, raised source/drain regions 28S/28D above the substrate on the top surface of the thin silicon layer 12. The problem that is illustrated by FIG. 1B has been overcome since there is no exposure of the upper corners of the gate electrode 18, so that there is no spurious growth of silicon nodules of the kind seen in FIG. 1B, because the top corners of the gate electrode 18 are protected by the dielectric plugs 26P.

At this point the polysilicon sidewall spacers 26S and top cap 22 can be removed from above the amorphous silicon cap 21 and the protective dielectric plugs 26P. Next, conventional process steps, as known to those skilled in the art, can be applied to finish the formation of the FET structure.

Formation of Undercut

Referring again to FIG. 3E, the etching step used to selectively undercut the selectively thin, amorphized layer 21B at the top of the blanket polysilicon layer 18B, as well as complete the gate polysilicon etch, will now be described with reference to FIG. 4. The polysilicon etch can be adjusted to produce a precision undercut at the top of the gate layer 18B. This is accomplished by using a three step etching process. This etching process which starts at step 40 in FIG. 4 is performed in a decoupled plasma etch reactor (not shown).

Formation of Top Notch/Undercut.

In step 42, the initial breakthrough and etching of the amorphized/predoped polysilicon cap layer 21B is performed. This process step uses a low pressure (4-6 mT) and high bias etch (180-200 W) with 80-120 HBr (hydrogen bromide) and a small amount of oxygen ($O_2$, 2-10 sccm). This step produces the undercut notches 24 by undercutting the thin, amorphous silicon cap layer 21B below the patterned hard mask 22. Further, the amount of the undercut of layer 21B is very precisely controlled by the $HBr/O_2$ ratio.

Passivation of Top Notch/Undercut For Precision TNG Control.

In step 44, a passivation step is performed in which sidewalls of notch 24 must be passivated to maintain the undercut notches 24 during remainder of gate etch. This step grows a silicon oxide layer (not shown) that is thicker on the exposed surface of the implant damaged/predoped thin, amorphous silicon cap layer 21B. Step 44 uses a pressure in the range of 40-60 mT, a high top source power (450-650 W), with pure oxygen ($O_2$, 100-150 sccm).

Horizontal Passivation Breakthrough Etch And Etching to Form the Polysilicon Gate Electrode and the Gate Dielectric Layer.

In step 46, a short breakthrough step is performed, followed by etching of the remaining polysilicon/gate dielectric stack, i.e. layers 18B/14B. The polysilicon and gate dielectric etch is a highly selective RIE process using materials such as HBr, Oxygen ($O_2$) and Helium (He) in the process. This process step uses a pressure range of 20-60 mT and top/bottom power of 200-400 W and 30-100 W respectively with HBr (150-300 sccm), Oxygen (4-10 sccm) and He as the diluent gas. This is a standard gate polysilicon/gate dielectric etch step.

The formation of the undercut and the polysilicon/gate dielectric etching process ends at step 48, with the device 10 being removed from the decoupled plasma etch reactor.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

The invention claimed is:

1. An improvement in a method of forming a MOSFET device, said MOSFET device including a semiconductor substrate with a silicon surface, with a gate electrode stack, with sidewall spacers on sidewalls of the gate electrode stack and raised source/drain regions formed on said silicon surface, with the gate electrode stack comprising a gate electrode formed of gate polysilicon formed over a gate dielectric layer formed on said silicon surface, said gate polysilicon having a top; said method comprising the steps preformed in the sequence as follows:
    forming a cap layer composed of amorphous silicon on said top of said gate electrode layer;
    forming a patterned mask for patterning said gate electrode stack over said cap layer with said mask covering a portion of said cap layer;
    performing an etching process undercutting said cap layer peripherally under said mask thereby forming a notch in said cap layer below said mask with said notch having notch sidewalls;
    passivating said notch sidewalls;
    patterning said gate electrode stack in said pattern of said mask with an etching process;
    filling said notch with dielectric plugs formed of sidewall spacer material on sidewalls of said gate polysilicon with said dielectric plugs and sidewall spacers covering sidewalls of said gate with forming said sidewall spacers reaching along the sidewalls of the gate electrode stack to above the level where said plugs contact said gate polysilicon; and
    forming raised source/drain regions on top of said silicon surface aside from said sidewall spacers,
    whereby formation of spurious epitaxial growth of silicon nodules on said sidewalls of said gate dielectric during the formation of raised source/drain regions is avoided.

2. The method of claim 1 wherein said amorphous silicon of said cap layer is formed by ion implantation of ions of germanium or silicon into said gate polysilicon prior to forming said patterned mask.

3. The method of claim 2 wherein said dielectric plugs and said sidewall spacers are formed by forming a blanket layer of a dielectric material selected from the group of consisting of silicon oxide and silicon nitride, which is etched back to form said plugs and said sidewall spacers.

4. The method of claim 1 wherein said dielectric plugs and said sidewall spacers are formed by forming a blanket layer of a dielectric material selected from the group of consisting of silicon oxide and silicon nitride, which is etched back to form said plugs and said sidewall spacers.

5. The method of claim 1 wherein said gate mask comprises a mask, and said cap layer comprises amorphous silicon formed by ion implantation of ions of germanium or silicon into said top of said gate polysilicon prior to forming said mask.

6. The method of claim 5 wherein said dielectric plugs and said sidewall spacers are formed by forming a blanket layer of a dielectric material selected from the group of consisting of silicon oxide and silicon nitride, which is etched back to form said plugs and said sidewall spacers.

7. The method of claim 1 wherein said dielectric plugs and said sidewall spacers are formed by forming a blanket layer of a dielectric material selected from the group of consisting of silicon oxide and silicon nitride, which is etched back to form said plugs and said sidewall spacers.

8. The method of claim 1 wherein:
    said mask comprises a hard mask, and
    said dielectric plugs and said sidewall spacers are formed by forming a blanket layer of a dielectric material selected from the group of consisting of silicon oxide and silicon nitride, which is etched back to form said plugs and said sidewall spacers.

9. The method of claim 1 wherein said cap layer is etched in the pattern of said mask with a low pressure (4-6 mT) and high bias etch (180-200 W) with 80-120 HBr (hydrogen bromide) and a small amount of oxygen ($O_2$, 2-10 sccm) forming said notch undercutting said cap layer peripherally under said mask.

10. The method of claim 1 including:
    patterning said cap layer and said gate electrode stack by low pressure (4-6 mT) and high bias etching (180-200 W) with 80-120 HBr (hydrogen bromide) and a small amount of oxygen ($O_2$, 2-10 sccm) with said mask, thereby forming said notch by said undercutting below said cap, and
    then passivating exposed surfaces of said cap layer by growing silicon oxide thereon a pressure in the range of 40-60 mT, a high tor source power (450-650 W), with pure oxygen ($O_2$, 100-150 sccm).

11. An improvement in a method of forming a MOSFET device comprising the steps performed in the order as follows:
    form a semiconductor substrate having an upper semiconductor surface;
    form a gate dielectric layer on said upper semiconductor surface;
    form a polysilicon layer over said gate dielectric layer having an upper polysilicon surface;
    implant ions into said upper polysilicon surface of said polysilicon layer forming an amorphous layer in said surface of said polysilicon layer;
    form a mask over said polysilicon layer;
    etch to form a notch with notch sidewalls recessed in sidewalls of said top surface of said gate electrode below said mask;
    then passivate said notch sidewalls by growing a silicon oxide layer thereon;
    perform a short breakthrough step followed by etching to form, below said mask, a stack of said polysilicon layer and said dielectric layer with exposed stack sidewalls on both thereof;
    form a blanket sidewall spacer layer of dielectric material filling said notch and covering said stack including said exposed stack sidewalls with said dielectric material;
    etch back said blanket sidewall spacer layer forming sidewall spacers composed of a dielectric material on said sidewalls and exposing said upper semiconductor surface aside from said sidewall spacers; and
    then form raised silicon source/drain regions on said upper semiconductor surface;
    whereby formation of spurious silicon nodules on said gate electrode proximate to said top surface of said gate electrode is inhibited.

12. The method of claim 11 wherein said cap layer comprises amorphous silicon layer formed by ion implantation of silicon or germanium ions implanted into said polysilicon prior to forming said mask.

13. The method of claim 12 wherein said cap layer is etched in the pattern of said mask with a low pressure high bias etch forming said notch by said undercutting below said cap layer.

14. The method of claim 12 wherein said dielectric plugs are formed after passivation of said notch sidewalls of said amorphous layer.

15. The method of claim 12 wherein:
peripheral undercut notches in said cap are formed recessed below said mask by employing a low pressure high bias etch forming said undercut notches by undercutting said cap layer peripherally below said mask with a low pressure (4-6 mT) and high bias etch (180-200 W) with 80-120 HBr (hydrogen bromide) and oxygen (O$_2$, 2-10 sccm), and
then passivating exposed surfaces of said cap layer in said undercut notches by growing silicon oxide thereon at a pressure in the range of 40-60 mT, a high top source power (450-650 W), with pure oxygen (O$_2$, 100-150 sccm).

16. The method of claim 12 wherein:
etching said cap layer as patterned by said mask with a low pressure high bias etch forming said notches by said undercutting below said cap;

passivating exposed surfaces of said cap layer by growing silicon oxide thereon a pressure in the range of 40-60 mT, a high tor source power (450-650 W), with pure oxygen (O$_2$, 100-150 sccm)

etching said polysilicon and said gate dielectric in a highly selective process in the pattern of said mask HBr, Oxygen (O$_2$) and Helium (He) in the process with a pressure range of 20-60 mT and with top/bottom power of 200-400 W and 30-100 W respectively with HBr (150-300 sccm), Oxygen (4-10 sccm) and He as the diluent gas.

* * * * *